US008370705B1

(12) United States Patent
Yu et al.

(10) Patent No.: US 8,370,705 B1
(45) Date of Patent: Feb. 5, 2013

(54) SYSTEM AND METHOD FOR CALCULATING A CHECKSUM ADDRESS WHILE MAINTAINING ERROR CORRECTION INFORMATION

(75) Inventors: Shu-Yi Yu, Sunnyvale, CA (US); Kevin Cameron, San Jose, CA (US)

(73) Assignee: NVIDIA Corporation, Santa Clara, CA (US)

(*) Notice: Subject to any disclaimer, the term of this patent is extended or adjusted under 35 U.S.C. 154(b) by 697 days.

(21) Appl. No.: 12/565,169

(22) Filed: Sep. 23, 2009

(51) Int. Cl.
*H03M 13/00* (2006.01)
*G11C 29/00* (2006.01)

(52) U.S. Cl. .................. 714/758; 714/766; 714/805
(58) Field of Classification Search .................. None
See application file for complete search history.

(56) References Cited

U.S. PATENT DOCUMENTS

| | | | | |
|---|---|---|---|---|
| 5,958,079 | A * | 9/1999 | Yoshimura | 714/766 |
| 6,263,470 | B1 * | 7/2001 | Hung et al. | 714/784 |
| 6,263,471 | B1 * | 7/2001 | Huang | 714/784 |
| 6,704,841 | B2 * | 3/2004 | Chaudhry et al. | 711/137 |
| 7,000,151 | B2 * | 2/2006 | Dwyer | 714/38.14 |
| 7,073,099 | B1 * | 7/2006 | Sutardja et al. | 714/710 |
| 8,024,391 | B2 * | 9/2011 | Douguet et al. | 708/491 |
| 2006/0168495 | A1 * | 7/2006 | Dominic et al. | 714/758 |
| 2008/0052569 | A1 * | 2/2008 | Ngo et al. | 714/718 |
| 2009/0055715 | A1 * | 2/2009 | Jashek et al. | 714/776 |
| 2009/0248780 | A1 * | 10/2009 | Symes et al. | 708/650 |
| 2011/0285742 | A1 * | 11/2011 | Kilgard et al. | 345/589 |

OTHER PUBLICATIONS

Papadopoulos et al., "Hashing + memory = low cost, exact pattern matching," Field Programmable Logic and Applications, 2005. International Conference on , vol., no., pp. 39-44, Aug. 24-26, 2005.*

* cited by examiner

*Primary Examiner* — Ajay Bhatia
*Assistant Examiner* — Daniel McMahon
(74) *Attorney, Agent, or Firm* — Patterson & Sheridan, LLP

(57) ABSTRACT

One or more embodiments of the invention set forth techniques to perform integer division using addition operations in order to provide address translation capabilities to a processor. The processor supports a memory that maintains checksum information such that address requests received by the processor need to be translated to a checksum address and an actual data address that accounts for use of portions of the memory to store checksum information. Once the checksum address and the actual data address are computed, the processor can confirm the integrity of the data stored in the actual data address and correct any errors if need be, based on the checksum information stored in the checksum address.

20 Claims, 4 Drawing Sheets

SYSTEM AND METHOD FOR CALCULATING A CHECKSUM ADDRESS WHILE MAINTAINING ERROR CORRECTION INFORMATION

BACKGROUND OF THE INVENTION

1. Field of the Invention

The present invention relates generally to computer arithmetic and more specifically to techniques for performing integer division.

2. Description of the Related Art

Current computer systems are typically configured with the hardware capability to support graphics processing units (GPUs) that offload graphics rendering tasks from the general purpose processor of the computer system to the specialized processors of the GPU. GPUs are designed with a highly parallelized structure to efficiently perform the complex and expensive computations required for rendering graphics. Many current GPUs are multi-core units configured to execute applications in a multi-threaded manner. For example, Nvidia's GeForce® 8 GPU has 128 processing cores, each having its own floating point unit (FPU) and a set of 1024 registers. Each cluster of 8 processing cores also has 16 KB of shared memory supporting parallel data access. Such an architecture is able to support up to 12,288 concurrent threads, with each thread having its own stack, registers (i.e., a subset of the set of 1024 registers in a processing core), program counter and local memory.

GPUs are increasingly utilized in mission critical or fault tolerant computer systems, where error correction is important. For example, computer systems used at high altitudes by the military or for space research may encounter levels of radiation that have the potential to affect and corrupt bits in a computer system's memory. To date, however, memory systems of GPUs have not been implemented with error correction capabilities. In order to support error correction capabilities, GPU memory systems need to allocate a portion of memory as storage for checksums that correspond to actual stored data. Calculating memory addresses for both the location of requested data and the corresponding location of the checksum for requested data requires the use of integer division.

However, many GPUs do not incorporate integer division logic into the digital circuit design of their arithmetic logic units (ALUs) because integer division operations tend to be infrequent operations that do not justify the hardware expense to incorporate such logic. Furthermore, the standard logic that is used to implement integer division is too slow and consumes too much circuit space for purposes of the memory address calculations discussed above.

As the foregoing illustrates, what is needed in the art is a technique enabling a GPU in a computer system to efficiently computed memory addresses using integer division for address translation purposes.

SUMMARY OF THE INVENTION

One or more embodiments of the present invention provide techniques to configure a GPU to perform integer division operations for address translation purposes when utilizing a GPU memory that maintains checksum information. Such techniques provide integer division capabilities by leveraging addition operations for address translations without requiring the GPU to support general integer division capabilities that require additional circuit space.

According to one embodiment of the present invention, a memory includes an error correction code (ECC) integrated circuit that is configured to receive a data request from a processor that includes a memory address associated with the requested data. The ECC integrated circuit then subdivides the memory address into a set of values corresponding to a plurality of coefficients in a polynomial equation that expresses the memory address in an X-based number system. For example, in one such embodiment, the polynomial equation is $\Sigma(A_i X^i)$, where i=0 to n and $A_i$ represents one of the plurality of coefficients. The ECC is then able to calculate a quotient value based on a summation of values, wherein each value is a concatenation of a plurality of a different one of the coefficients expressed in the X-based number system wherein each of the plurality corresponds to a position of the corresponding coefficient in the polynomial equation. For example, in one such embodiment in which the X based number system is an octal based number system, the summation is $(A_1)_8 + (A_2 A_2)_8 + (A_3 A_3 A_3)_8 + \ldots + (A_n \ldots A_n A_n)_8$. The ECC then computes a checksum address based on the quotient value and the value of X, requests error correction information from the computer system memory at a location corresponding to the checksum address, and confirms an integrity of the requested data by analyzing error correction information stored at the checksum address.

The ECC, according to one embodiment of the present invention, further calculates a remainder value based on a summation of the plurality of coefficients and is therefore able to compute a data address corresponding to the memory address based on the calculated remainder value and request data from the computer system memory at a location corresponding to the data address that the ECC can then transmit to the processor in response to the received data request. For example, in one such embodiment, the summation of the plurality of coefficients is $(A_0)_X + (A_1)_X + \ldots + (A_n)_X$.

One advantage of the disclosed ECC is that the foregoing integer division techniques can be incorporated into the integrated circuit to provide address translations for a memory maintaining error correction information without resorting to larger and less efficient standard integer division integrated circuits that are known in the art.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

In the following description, numerous specific details are set forth to provide a more thorough understanding of the present invention. However, it will be apparent to one of skill in the art that the present invention may be practiced without one or more of these specific details. In other instances, well-known features have not been described in order to avoid obscuring the present invention.

Figure 1:
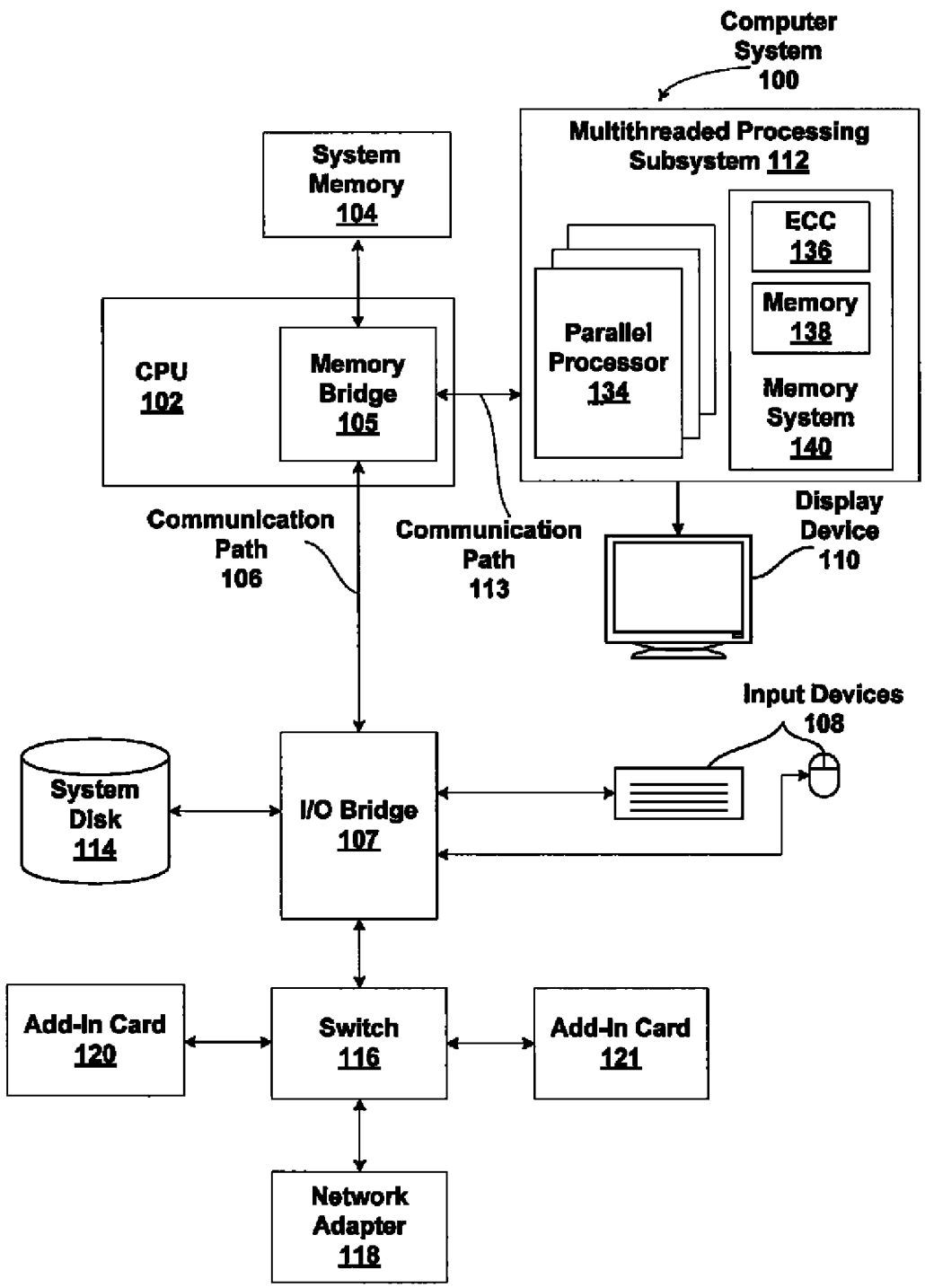
FIG. 1 is a block diagram of a computer system in which one or more embodiments of the invention may be implemented.

FIG. 1 is a block diagram of a computer system in which one or more embodiments of the invention may be implemented. Computer system 100 includes a CPU 102 and a system memory 104 communicating via a bus path that includes a memory bridge 105. Memory bridge 105, which may be, e.g., a northbridge chip, is connected via a bus or other communication path 106 (e.g., a HyperTransport link) to an I/O (input/output) bridge 107. I/O bridge 107, which may be, e.g., a southbridge chip, receives user input from one or more user input devices 108 (e.g., keyboard, mouse) and forwards the input to CPU 102 via path 106 and memory bridge 105. A system disk 114 is also connected to I/O bridge 107. A switch 116 provides connections between I/O bridge 107 and other components such as a network adapter 118 and various add-in cards 220 and 221. Other components (not explicitly shown), including USB or other port connections, CD drives, DVD drives, film recording devices, and the like, may also be connected to I/O bridge 107. Communication paths interconnecting the various components in FIG. 1 may be implemented using any suitable protocols, such as PCI (Peripheral Component Interconnect), PCI Express (PCI-E), AGP (Accelerated Graphics Port), HyperTransport, or any other bus or point-to-point communication protocol(s), and connections between different devices may use different protocols as is known in the art.

A multithreaded processing subsystem 112 is coupled to memory bridge 105 via a bus or other communication path 113 (e.g., a PCI Express, Accelerated Graphics Port, or HyperTransport link). In the embodiment of FIG. 1, multithreaded processing subsystem 112 is a graphics subsystem that delivers pixels to a display device 110 (e.g., a conventional CRT or LCD based monitor). Multithreaded processing subsystem 112 includes subsystem memory system 140 and incorporates one or more parallel processors 134. Subsystem memory system 140 includes an error correction code (ECC) block 136 as part of its memory control system as well as actual subsystem memory 138 where data is stored. One such example of a multithreaded processing system 212 is NVIDIA's GeForce® 8 GPU, which has 128 processing cores (i.e., processors), with each core having its own FPU and a set of 1024 registers. Each cluster of 8 processing cores also has 16 KB of shared memory supporting parallel data access. Such an architecture is able to support up to 12,288 concurrent threads, with each thread having its own stack, registers (i.e., a subset of the 1024 registers in a processing core), program counter and local memory. ECC block 136 is an integrated circuit component in subsystem memory 138 that performs error detection and correction on data stored in subsystem memory 138 in the event of data corruption and, as further described below, receives memory addresses corresponding to read and write requests received by processor 134 and converts the received memory address into a corresponding checksum address and a data address utilizing integer division.

CPU 102 operates as the control processor of computer system 100, managing and coordinating the operation of other system components. In particular, CPU 102 can issue graphics rendering related operations for execution on parallel processors 134 within multithreaded processing subsystem 112. For example, when executing an application that includes a portion of highly parallelized and computationally expensive graphics processing code, CPU 102 instructs multithreaded processing subsystem 112 to perform the instructions of the code portion in order to leverage parallel processors 134. Those with ordinary skill in the art will recognize that FIG. 1 is merely one exemplary embodiment of a computing system in which the inventions disclosed herein may be utilized and that any computing system architecture can utilize the teachings herein.

Figure 2:
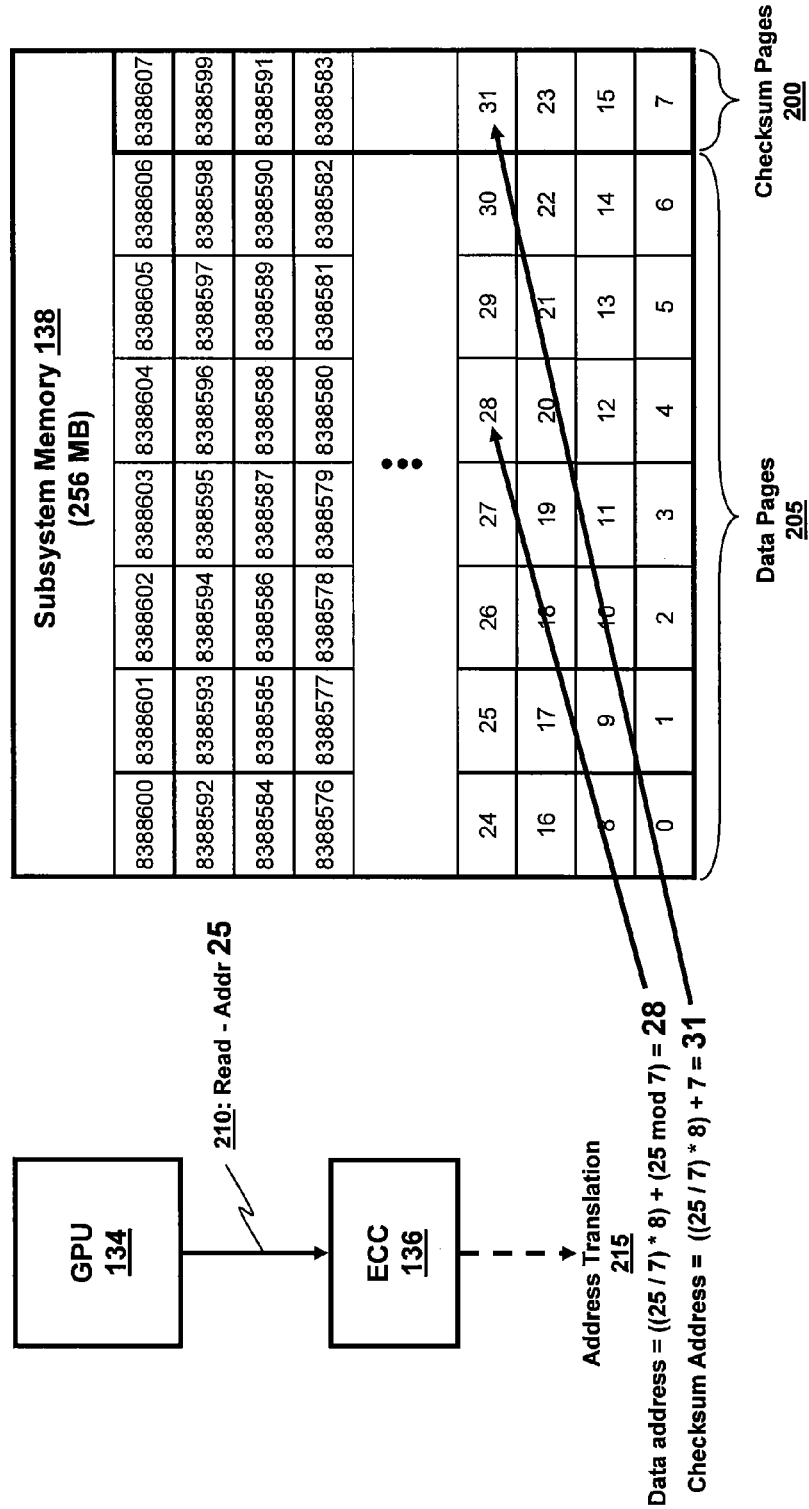
FIG. 2 depicts an error correction code block of a memory performing address translation using integer division, according to one embodiment of the invention.

FIG. 2 depicts an error correction code (ECC) block of a memory performing address translation using integer division, according to one embodiment of the invention. Although the example is described in conjunction with components of computer system 100 of FIG. 1, persons skilled in the art will understand that any computer system may be configured with an error correction code block in accordance with FIG. 2.

In FIG. 2, for exemplary purposes, GPU memory 138 is a memory of 256 MBs that has been subdivided into 32 byte addressable blocks and has been configured to maintain checksums for error correction purposes. As depicted, each row of memory has been subdivided into 8 (i.e., $2^N$ where N=3) memory blocks. For every 7 (i.e., $2^N-1$) memory block that store true data store in the row, an $8^{th}$ memory block maintains a checksum value enabling errors to be corrected within the 7 other memory blocks in the row. In the example of FIG. 2, column 200 represents those memory blocks that are used to store checksums for error correction purposes and columns 205 represent those memory blocks in which actual data is stored. ECC block 136 performs address translation on behalf of GPU 134 so that the checksum structure of GPU memory 138 is transparent to applications that read or write to GPU memory 138. For example, as depicted in FIG. 2, GPU 134 receives a read request for memory block 25 in GPU memory 138 and forwards the read request 210 to ECC 136. As a result of the use of memory blocks in column 200 for checksum purposes, it should be recognized that a request for memory block 25 does not directly correlate to memory block 25 in GPU memory 138. As such, upon receiving the read request, ECC block 136 performs address translation on memory block 25 to obtain the checksum address as well as the data address where the true data resides. Specifically, the address translation formulas for GPU memory 138 are presented in Table 1 below:

TABLE 1

| Address Translation Formulas | |
|---|---|
| Checksum Address: | ((Original Request Address/7) * 8) + 7 |
| Actual Data Address: | ((Original Request Address/7) * 8) + (Original Request Address mod 7) |

Using the formulas of Table 1, ECC block 136 receives the original request address, memory block 25, as shown in step 210, and, as shown in step 215, utilizes integer division operations (i.e., "/" and "mod" operations) to calculate the checksum address as memory block 31 and the actual data address as memory block 28. It should be recognized that the formulas used to derive the checksum address and data address are dependent upon where memory 138 stores the checksum blocks.

In order to calculate the checksum address and actual data address, ECC block 136 is configured to implement integer division through use of addition operations based upon the basic polynomial equation:

$$X^n = (X^n - 1) + 1 \\ = (X - 1)(X^{n-1} + X^{n-2} + \ldots + X + 1) + 1 \qquad \text{Eq. A}$$

Specifically, any memory address received by GPU 134, for example, is an integer, N, that can be expressed in a base X number system as:

$$N = \Sigma(A_i X^i), \text{where } i = 0 \text{ to } n \qquad \text{Eq. B}$$

Due to the binary nature of computer systems, base X values that are typically utilized in relation to computers systems are binary, octal, hexadecimal or any other $2^N$ based number. For example, with respect to the example for FIG. 2, memory block 25 would be expressed in octal as oct(31) or $(31)_8$ as further detailed below:

TABLE 2

Decimal to Octal Conversion

| Decimal Representation | Octal Representation |
|---|---|
| N = 25 | $N = \Sigma(A_i 8^i)$, where $i = 0$ to $n$ and $0 < A_i < 7$ |
| | $= (3*8^1) + (1*8^0)$ |
| | $= oct(31)$ |

Substituting Eq. A above into Eq. B above, the following equation is derived for an integer N:

$$N = \Sigma(A_i X^i), \text{ where } i = 0 \text{ to } n \qquad \text{Eq. C}$$
$$= \Sigma(A_i(X^i - 1 + 1))$$
$$= \Sigma(A_i(X^i - 1)) + \Sigma A_i$$
$$= \Sigma(A_i(X - 1)(X^{i-1} + X^{i-2} + \ldots + X + 1)) + \Sigma A_i$$
$$= (X - 1)\Sigma(A_i(X^{i-1} + X^{i-2} + \ldots + X + 1)) + \Sigma A_i$$

Furthermore, any integer N may also be generally considered to be the summation of the product of a quotient, Q and a divisor, D, summed with a remainder, R, as follows:

$$N = Q*D + R \qquad \text{Eq. D}$$

any divisor D can be rewritten as $(X - 1)$ for a base X such that:

$$= Q(X - 1) + R$$

Combining Eq. C above and Eq. D above:

$$N = (X-1)Q + R \qquad \text{Eq. E}$$

where:
$Q = \Sigma(A_i(X^{i-1} + X^{i-2} + \ldots + X + 1))$, where i=1 to n
$R = \Sigma A_i$, where i=0 to n
when, for example, base X=8 is used, Q and R can be expressed as:

$Q = oct(A_1) + oct(A_2 A_2) + oct(A_3 A_3 A_3) + \ldots + oct(A_n \ldots A_n A_n A_n)$;

$R = oct(A_0) + oct(A_1) + oct(A_2) + \ldots + oct(A_n)$;

As can be seen, both the quotient, Q, and remainder, R, can be determined using addition operations. Returning to Table 1, it should be recognized that the integer division calculation, "Original Request Address/7," in the checksum address and actual data address calculations correspond to a quotient Q, and the integer division calculation, "Original Request Address mod 7," in the actual data address calculation corresponds to a remainder R.

Figure 3:
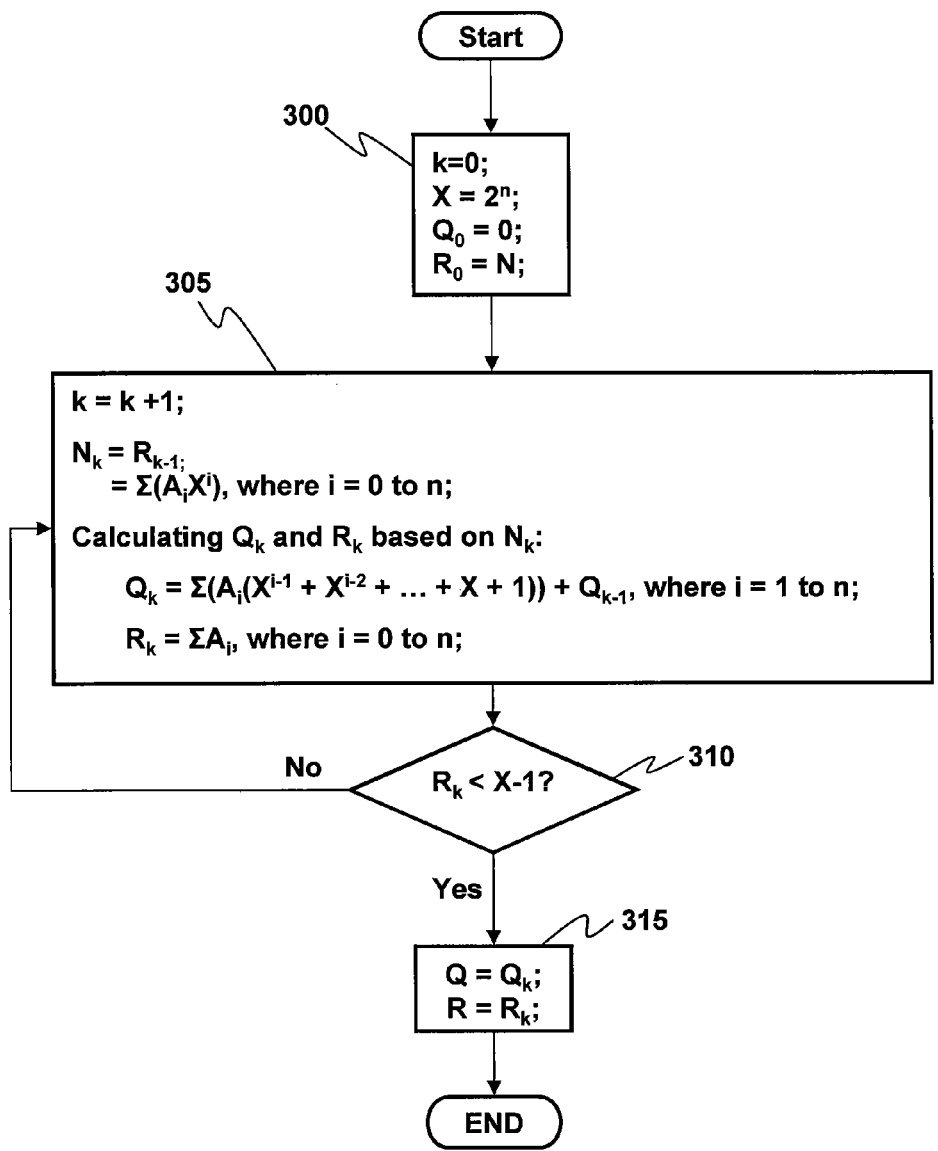
FIG. 3 is a flow diagram of method steps to iteratively calculate a quotient, Q, and remainder, R, for a number, N represented in base X and a divisor having a value of (X−1), according to one embodiment of the invention.

FIG. 3 is a flow diagram of method steps to iteratively calculate a quotient, Q, and remainder, R, for a number, N represented in base X and a divisor having a value of (X−1), according to one embodiment of the invention. Returning to the example of FIG. 2, in which ECC block 136 receives memory block 25 for address translation, N is 25, which is oct(31) in base 8 (i.e., $2^3$) and as discussed above and depicted in Table 1, the divisor is 7 which is X−1 (i.e., $2^3$−1). Below is a description working through the steps of FIG. 3 for N=25:

Step 300:

$N = 25$;
$= oct(31)$;
$= \Sigma(A_i 8^i)$, where $i = 0$ to $1$
$A_0 = 1$ and $A_1 = 3$ k=0;
X=8=$2^3$;
$Q_0$=0;
$R_0$=N=oct(31);
First Iteration, k=1 (Step 305):

$Q_1 = oct(A_1)$;
$= oct(3)$;
$= 3$;

$R_1 = oct(A_0) + oct(A_1)$;
$= oct(1) + oct(3)$;
$= oct(4)$;
$= 4$;

Because R<7 (i.e., X−1) per Step 310, Proceed to Step 315
$Q_i = Q = 3$;
$R_i = R = 4$;
Because Q=3 and R=4 from above, ECC block 136 further calculates the checksum address as: (Q*8)+7=(3*8)+7=31 and the actual data address as: (Q*8)+R=28, as depicted in FIG. 2.

Figure 4:
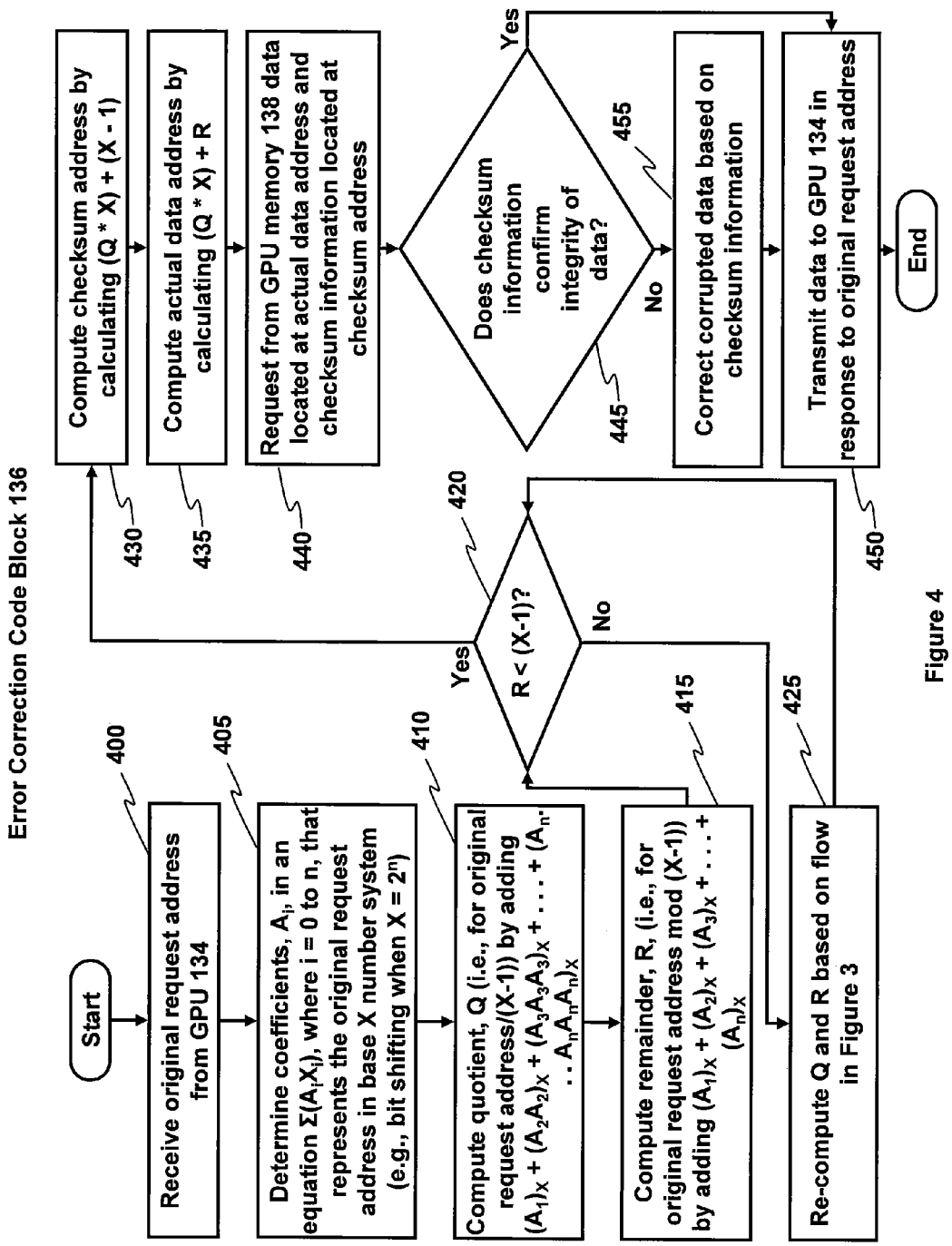
FIG. 4 is a flow diagram of method steps for determining a checksum address and an actual data address in an error correction block of a memory, according to one embodiment of the invention.

FIG. 4 is a flow diagram of method steps for determining a checksum address and an actual data address in an error correction block of a GPU, according to one embodiment of the invention. Although the method steps are described in conjunction with FIG. 1, persons skilled in the art will understand that any system configured to perform the method steps, in any order, falls within the scope of the present invention.

In step 400, ECC block 136 of GPU memory 138 receives a request to access data stored in GPU memory 138, such as a read request, comprising an original memory address. In step 405, ECC block 136 determines the coefficients, $A_i$, in an equation $\Sigma(A_i X^i)$, where i=0 to n, that expresses the original memory address in an X-based number system. For example, in one embodiment, $X=2^3=8$ such that each $A_i$ from i=0 to n corresponds a value of a subsequent set of 3 contiguous bits from left to right in the original memory address. In step 410, the quotient Q of Eq. E can be computed by adding $(A_1)_X + (A_2 A_2)_X + (A_3 A_3 A_3)_X + \ldots + (A_n \ldots A_n A_n A_n)_X$ (e.g., for an octal based system, $oct(A_1) + oct(A_2 A_2) + oct(A_3 A_3 A_3) + \ldots + oct(A_n \ldots A_n A_n A_n)$). In step 415, a remainder R of Eq. E can be determined by adding $(A_0)_X + (A_1)_X + \ldots + (A_n)_X$ (e.g., for an octal based system, $oct(A_0) + oct(A_1) + \ldots + oct(A_n)$). In step 420, if R is greater than or equal to (X−1), ECC block 136 re-computes Q and R per the flow in FIG. 3, in step 425. In step 430, a checksum address is computed by multiplying Q by X (e.g., 8) and then adding (X−1) and in step 435, a data address is computed by adding R to (Q*X). It should be recognized, however, that the use of Q and R to compute checksum address and data addresses is dependent upon where the checksum blocks are stored within any particular memory structure and may therefore vary from the calculations performed in steps 430 and 435 in alternative embodiments. Once ECC block 136 has computed both the checksum address and the data address, it can request from GPU memory 138 the data located at the data address and the checksum information located at the checksum address in step 440. In step 445, if the request checksum information confirms the integrity of the data stored in the data address, then in step 450, ECC block 136 transmits the data to the GPU 134. Alternatively, if in step 445, ECC block 136 determines that the data located in data address is corrupted, then step 455, ECC block 136 corrects the data corruption prior to sending the data to GPU 134 in step 450.

While the foregoing is directed to embodiments of the present invention, other and further embodiments of the invention may be devised without departing from the basic scope thereof. For example, while the foregoing discloses embodiments that utilize integer division techniques within the context of an ECC block of a memory, it should be recognized that the techniques may be implemented in any component of a computer system, whether hardware or software, where integer division using a divisor of (X−1) and a dividend that is expressed in an X based number system may be utilized. Similarly, while the octal based system has been used as an example because GPU memory 138 of FIG. 2 stored checksum information in every $8^{th}$ memory block, it should be recognized than any X based number system may utilize the techniques herein. Similarly, while the ECC block has been described as translating addresses for a GPU memory, it should be recognized that the address translation can be applied to any memory, including the computer system's own memory. Additionally, while Table 1 herein has specified a particular address translation formula for translating an address into a checksum address and actual data address, it should be recognized that such a formula is dependent upon where the checksum blocks are stored within a memory and that any translation formulas using the integer division techniques may be utilized consistent with the teachings herein, depending upon where the checksum block is stored within the memory. For example, in an alternative embodiment, the checksum blocks are stored in the first column of the memory (e.g., blocks 0, 8, 16 . . . in FIG. 2) and an alternative checksum address formula is Original Request Address/7*8 and a corresponding true data address formula is Original Request Address mod 7+Checksum Address+1 for such an alternative embodiment.

In addition, aspects of the present invention may be implemented in hardware or software or in a combination of hardware and software. One embodiment of the invention may be implemented as a program product for use with a computer system. The program(s) of the program product define functions of the embodiments (including the methods described herein) and can be contained on a variety of computer-readable storage media. Illustrative computer-readable storage media include, but are not limited to: (i) non-writable storage media (e.g., read-only memory devices within a computer such as CD-ROM disks readable by a CD-ROM drive, flash memory, ROM chips or any type of solid-state non-volatile semiconductor memory) on which information is permanently stored; and (ii) writable storage media (e.g., floppy disks within a diskette drive or hard-disk drive or any type of solid-state random-access semiconductor memory) on which alterable information is stored. Such computer-readable storage media, when carrying computer-readable instructions that direct the functions of the present invention, are embodiments of the present invention.

In view of the foregoing, the scope of the present invention is determined by the claims that follow.

We claim:

1. A computer-implemented method for calculating a checksum address in a computer system memory configured to maintain error correction information, the method comprising:
   receiving a data request from a processor that includes a memory address associated with the requested data;
   subdividing the memory address into a plurality of coefficients in a polynomial equation, wherein the polynomial equation expresses the memory address in an X-based number system;
   calculating a quotient value based on a summation of concatenated coefficient values, wherein each concatenated coefficient value comprises a concatenation of a different coefficient included in the plurality of coefficients and corresponds to a position of the different coefficient in the polynomial equation;
   computing the checksum address based on the quotient value and a value of X;
   requesting error correction information from the computer system memory at a location corresponding to the checksum address; and
   confirming an integrity of the requested data by analyzing error correction information stored at the checksum address.

2. The method of claim 1, wherein the polynomial equation is $\Sigma(A_i X^i)$, where i=0 to n and $A_i$ represents one of the plurality of coefficients, the summation is $(A_1)_X + (A_2 A_2)_X + (A_3 A_3 A_3)_X + \ldots + (A_n \ldots A_n A_n)_X$, and the checksum address is computed by adding the value of (X−1) to the product of the quotient value and the value of X.

3. The method of claim 2, wherein the X-based number system is a binary number system, wherein X is equal to $2^N$.

4. The method of claim 3, wherein the computer system memory comprises a plurality of memory blocks, and the checksum information is stored in an $X^{th}$ memory block for every (X−1) memory blocks.

5. The method of claim 1, further comprising the steps of: calculating a remainder value based on a summation of the plurality of coefficients; computing a data address corresponding to the memory address based on the calculated remainder value; requesting data from the computer system memory at a location corresponding to the data address; and transmitting the data to the processor.

6. The method of claim 5, wherein the summation of the plurality of coefficients is $(A_0)_X+(A_1)_X+\ldots+(A_n)_X$ and the data address is computed by adding the remainder value to the product of the quotient value and the value of X.

7. The method of claim 6, further comprising the step of re-computing the quotient value and the remainder value if the remainder value is greater than or equal to (X−1).

8. A non-transitory computer-readable medium including instructions that, when executed by a processing unit, causes the processing unit to calculate a checksum address in a computer system memory configured to maintain error correction information by performing the steps of:
 receiving a data request from a processor that includes a memory address associated with the requested data;
 subdividing the memory address into a plurality of coefficients in a polynomial equation, wherein the polynomial equation expresses the memory address in an X-based number system;
 calculating a quotient value based on a summation of concatenated coefficient values, wherein each concatenated coefficient value comprises a concatenation of a different coefficient included in the plurality of coefficients and corresponds to a position of the different coefficient in the polynomial equation;
 computing the checksum address based on the quotient value and the value of X;
 requesting error correction information from the computer system memory at a location corresponding to the checksum address; and
 confirming an integrity of the requested data by analyzing error correction information stored at the checksum address.

9. The computer-readable medium of claim 8, wherein the polynomial equation is $\Sigma(A_i X^i)$, where i=0 to n and $A_i$ represents one of the plurality of coefficients, the summation is $(A_1)_X+(A_2 A_2)_X+(A_3 A_3 A_3)_X+\ldots+(A_n \ldots A_n A_n)_X$, and the checksum address is computed by adding the value of (X−1) to the product of the quotient value and the value of X.

10. The computer-readable medium of claim 9, wherein the X-based number system is a binary number system where X is $2^N$.

11. The computer-readable medium of claim 10, wherein the computer system memory comprises a plurality of memory blocks and the checksum information is stored in an $X^{th}$ memory block for every (X−1) memory blocks.

12. The computer-readable medium of claim 9, wherein the processing unit further performs the steps: calculating a remainder value based on a summation of the plurality of coefficients; computing a data address corresponding to the memory address based on the calculated remainder value; requesting data from the computer system memory at a location corresponding to the data address; and transmitting the data to the processor.

13. The computer-readable medium of claim 12, wherein the summation of the plurality of coefficients is $(A_0)_X+(A_1)_X+\ldots+(A_n)_X$ and the data address is computed by adding the remainder value to the product of the quotient value and the value of X.

14. An error correction code integrated circuit designed to calculate a checksum address in a computer system memory maintaining error correction information, the error correction code integrated circuit configured to:
 receive a data request from a processor that includes a memory address associated with the requested data;
 subdivide the memory address into a plurality of coefficients in a polynomial equation, wherein the polynomial equation expresses the memory address in an X-based number system;
 calculate a quotient value based on a summation of concatenated coefficient values, wherein each concatenated coefficient value comprises a concatenation of a different coefficient included in the plurality of coefficients and corresponds to a position of the different coefficient in the polynomial equation;
 compute the checksum address based on the quotient value and the value of X;
 request error correction information from the computer system memory at a location corresponding to the checksum address; and
 confirm an integrity of the requested data by analyzing error correction information stored at the checksum address.

15. The error correction code integrated circuit of claim 14, wherein the polynomial equation is $\Sigma(A_i X^i)$, where i=0 to n and A represents one of the plurality of coefficients, the summation is $(A_1)_X+(A_2 A_2)_X+(A_3 A_3 A_3)_X+\ldots+(A_n \ldots A_n A_n)_X$, and the checksum address is computed by adding the value of (X−1) to the product of the quotient value and the value of X.

16. The error correction code integrated circuit of claim 15, wherein the X-based number system is a binary number system where X is $2^N$.

17. The error correction code integrated circuit of claim 16, wherein the computer system memory comprises a plurality of memory blocks and the checksum information is stored in an $X^{th}$ memory block for every (X−1) memory blocks.

18. The error correction code integrated circuit of claim 14, further configured to: calculate a remainder value based on summation of the plurality of coefficients; compute a data address corresponding to the memory address based on the calculated remainder value; request data from the computer system memory at a location corresponding to the data address; and transmit the data to the GPU.

19. The error correction code integrated circuit of claim 18, wherein the summation of the plurality of coefficients is $(A_0)_X+(A_1)_X+\ldots+(A_n)_X$ and the data address is computed by adding the remainder value to the product of the quotient value and the value of X.

20. The error correction code integrated circuit of claim 19, further configured to re-computing Q and R if R is greater than or equal to (X−1).

\* \* \* \* \*